(12) United States Patent
Tien et al.

(10) Patent No.: US 9,890,930 B2
(45) Date of Patent: Feb. 13, 2018

(54) LIGHT SOURCE MODULE

(71) Applicant: LEXTAR ELECTRONICS CORPORATION, Hsinchu (TW)

(72) Inventors: Yun-Yi Tien, Hsinchu (TW); Pei-Song Cai, Miaoli County (TW); Jian-Chin Liang, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 1084 days.

(21) Appl. No.: 13/709,655

(22) Filed: Dec. 10, 2012

(65) Prior Publication Data

US 2013/0322067 A1  Dec. 5, 2013

(30) Foreign Application Priority Data

Jun. 4, 2012 (TW) .............................. 101119974 A (51) Int. Cl.

| F21V 1/00 | (2006.01) |
|---|---|
| F21V 9/16 | (2006.01) |
| H01L 25/075 | (2006.01) |
| H01L 33/50 | (2010.01) |
| H01L 33/60 | (2010.01) |
| F21Y 115/10 | (2016.01) |

(52) U.S. Cl.
CPC ............ *F21V 9/16* (2013.01); *H01L 25/0753* (2013.01); *F21Y 2115/10* (2016.08); *H01L 33/504* (2013.01); *H01L 33/60* (2013.01); *H01L 2924/0002* (2013.01)

(58) Field of Classification Search
CPC ................................. F21V 9/16; H01L 33/504
USPC .................................. 362/84, 231, 613, 800
See application file for complete search history.

(56) References Cited

U.S. PATENT DOCUMENTS

| 2007/0081360 A1* | 4/2007 | Bailey | G02B 6/0021 |
| | | | 362/621 |
| 2009/0140630 A1* | 6/2009 | Kijima | C09K 11/661 |
| | | | 313/498 |
| 2010/0025700 A1* | 2/2010 | Jung | H01L 25/0753 |
| | | | 257/89 |
| 2010/0207134 A1* | 8/2010 | Tanaka | F21K 9/00 |
| | | | 257/89 |
| 2010/0207512 A1* | 8/2010 | Miyagawa et al. | 313/503 |

(Continued)

FOREIGN PATENT DOCUMENTS

| CN | 1790708 A | 6/2006 |
| CN | 1832167 A | 9/2006 |

(Continued)

*Primary Examiner* — Andrew Coughlin
(74) *Attorney, Agent, or Firm* — Moser Taboada (57) ABSTRACT

A light source module includes a substrate, a first illumination element, a second illumination element and a third illumination element. The first illumination element includes a blue LED chip disposed on the substrate and a first wavelength converting layer that covers the blue LED chip, in which blue light emitted from the blue LED chip can be converted to light in the range of a first wavelength. The second illumination element includes a blue LED chip disposed on the substrate and a second wavelength converting layer that covers the blue LED chip, in which blue light emitted from the blue LED chip can be converted to light in the range of a second wavelength. The third illumination element includes a blue LED chip.

6 Claims, 8 Drawing Sheets

(56) References Cited

U.S. PATENT DOCUMENTS

| | | | |
|---|---|---|---|
| 2011/0116271 A1* | 5/2011 | Ide et al. | 362/294 |
| 2011/0176293 A1* | 7/2011 | Park | 362/97.3 |
| 2011/0210311 A1 | 9/2011 | Kim et al. | |
| 2012/0112661 A1* | 5/2012 | van de Ven et al. | 315/294 |
| 2013/0010460 A1* | 1/2013 | Peil | F21K 9/00 362/217.14 |

FOREIGN PATENT DOCUMENTS

| | | |
|---|---|---|
| CN | 101059621 A | 10/2007 |
| CN | 101614339 A | 12/2009 |
| CN | 101671560 A | 3/2010 |
| CN | 101761810 A | 6/2010 |
| CN | 102080787 A | 6/2011 |
| CN | 102347419 A | 2/2012 |
| CN | 102347431 A | 2/2012 |
| TW | 201013982 A | 4/2010 |
| TW | 201015758 A | 4/2010 |
| TW | 201025557 A | 7/2010 |
| TW | I347475 | 8/2011 |
| TW | I356948 | 1/2012 |
| TW | 201205877 A | 2/2012 |
| TW | M430005 U | 5/2012 |
| WO | WO-2011163240 A1 | 12/2011 |

\* cited by examiner

LIGHT SOURCE MODULE

RELATED APPLICATIONS

This application claims priority to Taiwan Application Serial Number 101119974, filed Jun. 4, 2012, which is herein incorporated by reference.

BACKGROUND

Technical Field

Embodiments of the present invention relate to a light source module. More particularly, embodiments of the present invention relate to a light source having LEDs.

Description of Related Art

In recent years, energy issues have been the focus of much attention. In order to save energy, the light emitting diode (LED), which has many advantages such as low power consumption and high efficiency, is quickly replacing incandescent light bulbs and fluorescent lamps.

Generally, a conventional LED lamp includes a plurality of blue LED chips, red LED chips and green LED chips, and they are all mounted on a substrate. Each LED chip is covered in a package and is electrically connected to a control circuit for receiving power.

However, because the LED packages cannot be placed closely in a precise manner, there is a significant spacing between two LED packages, and therefore, the LED packages cannot be arranged in close proximity to one another. As a result, the number of the LED packages that can be placed in a fixed area is limited, and the overall size of the light source module cannot be minimized, ultimately resulting in a waste of space and an increase in the cost of the light source module. Further, because of such significant spacing between two LED packages, the light source module looks like a surface with many dot light sources and the light outputted by the light source module is non-uniform.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment of the present invention, a light source module includes a substrate, a first illumination element, a second illumination element and a third illumination element. The first illumination element includes a blue LED chip disposed on the substrate, and a first wavelength converting layer that covers the blue LED chip of the first illumination element. Blue light emitted from the blue LED chip of the first illumination element is converted to light in the range of a first wavelength by the first wavelength converting layer. The second illumination element includes a blue LED chip disposed on the substrate and a second wavelength converting layer that covers the blue LED chip of the second illumination element. Blue light emitted from the blue LED chip of the second illumination element is converted to light in the range of a second wavelength by the second wavelength converting layer. The third illumination element includes a blue LED chip.

In accordance with another embodiment of the present invention, a light source module includes a substrate, a first illumination element, a second illumination element and a third illumination element. The first illumination element includes a short wavelength LED chip disposed on the substrate and a first wavelength converting layer covering the short wavelength LED chip of the first illumination element. The light in the range of the fourth wavelength emitted from the short wavelength LED chip of the first illumination element is converted to light in the range of a first wavelength by the first wavelength converting layer. The second illumination element includes a short wavelength LED chip disposed on the substrate and a second wavelength converting layer covering the short wavelength LED of the second illumination element. The light in the range of the fourth wavelength emitted from the short wavelength LED chip of the second illumination element is converted to light in a range of a second wavelength by the second wavelength converting layer. The third illumination element includes a short wavelength LED chip disposed on the substrate and a third wavelength converting layer covering the short wavelength LED of the third illumination element. The light in the range of the fourth wavelength emitted from the short wavelength LED chip of the third illumination element is converted to light in a range of a third wavelength by the third wavelength converting layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

It will also be understood that, although the terms first, second, third, etc. may be used herein to describe various elements, these elements should not be limited by these terms. These terms are only used to distinguish one element from another. For example, a first illumination element could be termed a second illumination element, and, similarly, a second illumination element could be termed a first illumination element, without departing from the scope of the present disclosure.

Figure 1:
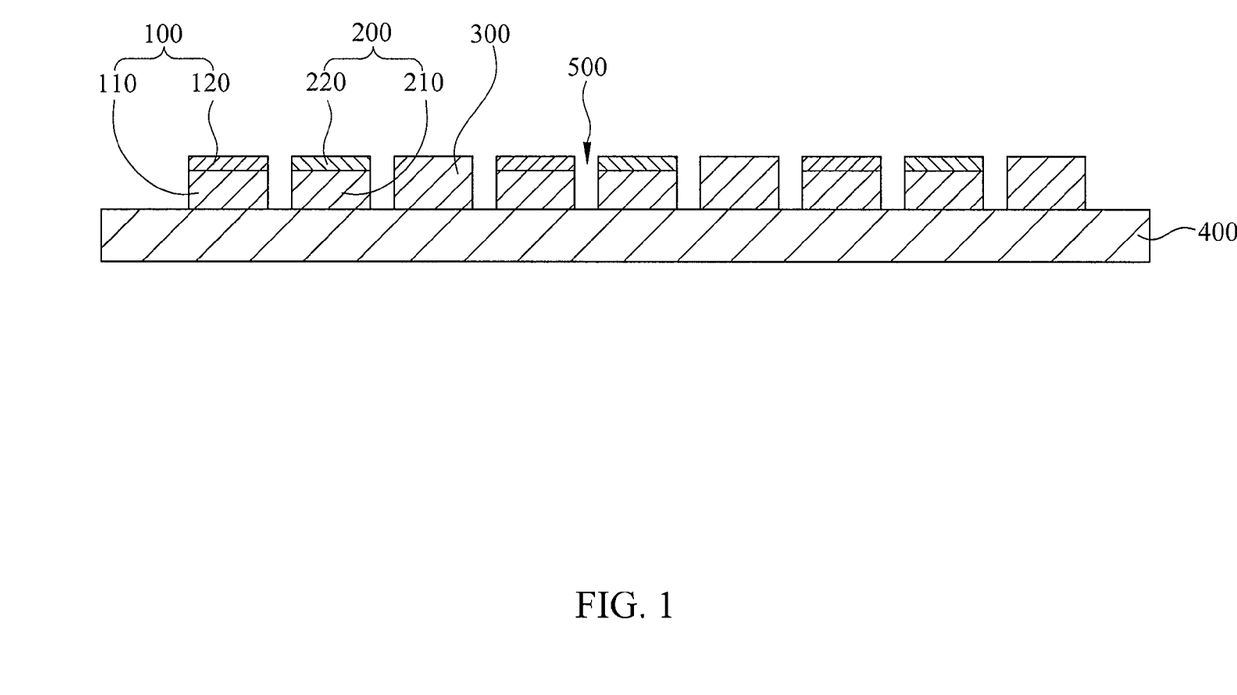
FIG. 1 is a cross-sectional view of a light source module in accordance with one embodiment of the present invention.

FIG. 1 is a cross-sectional view of a light source module in accordance with one embodiment of the present invention. As shown in this figure, the light source module includes a substrate 400, a first illumination element 100, a second illumination element 200 and a third illumination element 300. The first illumination element 100 includes a blue LED chip 110 disposed on the substrate 400. The blue LED chip 110 is covered by a first wavelength converting layer 120, so that blue light emitted from the blue LED chip 110 is converted to light in the range of a first wavelength. The second illumination element 200 includes a blue LED chip 210 disposed on the substrate 400. The blue LED chip 210 is covered by a second wavelength converting layer 220, so that blue light emitted from the blue LED chip 210 can be converted to light in the range of a second wavelength. The third illumination element 300 includes a blue LED chip.

In the embodiment described above, the blue LED chip 110, the blue LED chip 210 and the blue LED chip 300 are directly mounted on the substrate 400 without being packaged. Because LED chips can be mounted with a higher degree of precision than LED packages, the blue LED chips 110, 210 and 300 can be mounted on the substrate 400 in close proximity to one another. Therefore, the size of the light source module can be minimized, and the light outputted by the light source module can be uniform because the blue LED chips 110, 210 and 300 are mounted close to each other.

Figure 2:
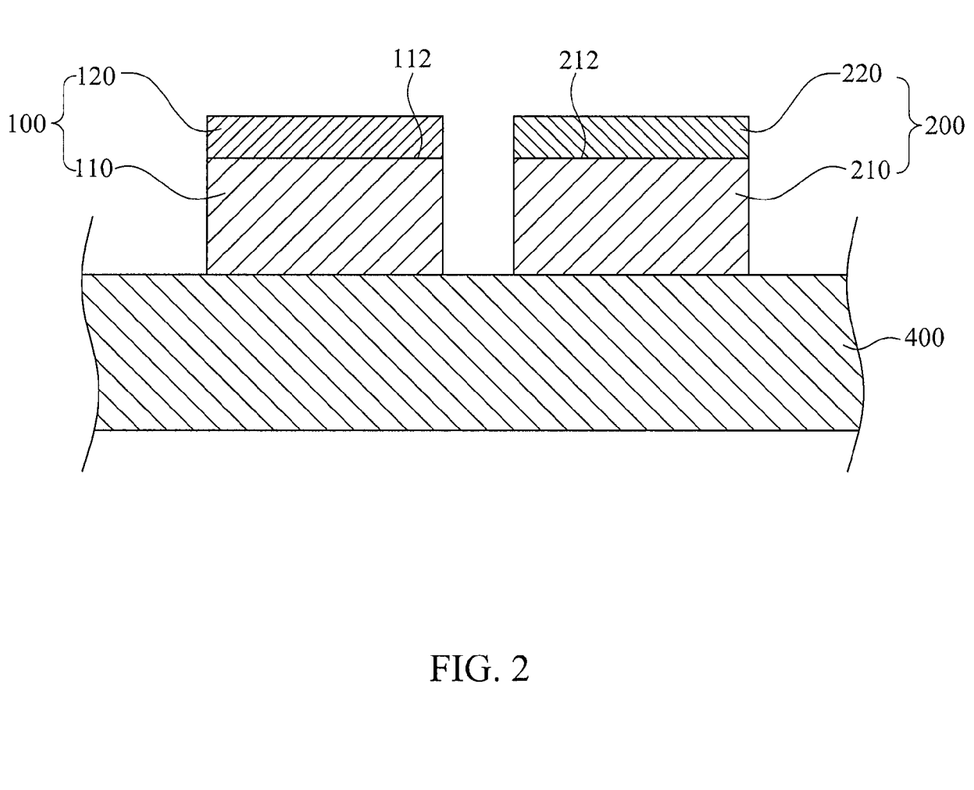
FIG. 2 is a partial cross-sectional view of the light source module of FIG. 1.

FIG. 2 is a partial cross-sectional view of the light source module of FIG. 1. In some embodiments, a first light outputting surface 112 of the blue LED chip 110 of the first illumination element 100 is directly covered by the first wavelength converting layer 120, and a second light outputting surface 212 of the blue LED chip 210 of the second illumination element 200 is directly covered by the second wavelength converting layer 220, as shown in FIG. 2. Therefore, the blue light emitted by the blue LED chip 110 of the first illumination element 100 can be converted by the first wavelength converting layer 120, and the blue light emitted by the blue LED chip 210 of the second illumination element 200 can be converted by the second wavelength converting layer 220.

In some embodiments, the area of the first wavelength converting layer 120 is substantially equal to the area of the first light outputting surface 112 of the LED chip 110 of the first illumination element 100. Moreover, in some embodiments, the area of the second wavelength converting layer 220 is substantially equal to the area of the second light outputting surface 212 of the LED chip 210 of the second illumination element 200. In other words, the first wavelength converting layer 120 exactly covers the whole first light outputting surface 112 of the blue LED chip 110. Similarly, the second wavelength converting layer 220 exactly covers the whole second light outputting surface 212 of the blue LED chip 210.

In some embodiments, the first wavelength converting layer 120 includes red phosphor, red dye or red pigment, and the second wavelength converting layer 220 includes green phosphor, green dye or green pigment. In other words, the first wavelength described above is in the range of red light, and the second wavelength described above is in the range of green light. Specifically, the first wavelength converting layer 120 converts the blue light emitted by the blue LED chip 110 to red light, and the second wavelength converting layer 220 converts the blue light emitted by the blue LED chip 210 to green light. Further, because no wavelength converting material is placed on the third illumination element 300 (See FIG. 1), the blue light emitted by the third illumination element 300 is not converted. Therefore, the light source module of the embodiment of the present invention outputs white light by mixing the red light outputted by the first illumination element 100, the green light outputted by the second illumination element 200 and the blue light outputted by the third illumination element 300.

The first wavelength converting layer 120 and the second wavelength converting layer 220 can be formed by various processes. For example, the first wavelength converting layer 120 and the second wavelength converting layer 220 can be respectively formed on the blue LED chip 110 and the blue LED chip 210 by photolithography. Specifically, the material of the first wavelength converting layer 120 (e.g., red phosphor, red dye or red pigment) can be blended in a negative photoresist, and the first wavelength converting layer 120 can remain on the first light outputting surface 112 of the blue LED chip 110 based on the mask design after exposure development. Similarly, the material of the second wavelength converting layer 220 (e.g., green phosphor, green dye or green pigment) can also be blended in the negative photoresist, and the second wavelength converting layer 220 can remain on the second light outputting surface 212 of the blue LED chip 210 based on the mask design after exposure development.

It is noted that the photolithography process to form the first wavelength converting layer 120 and the second wavelength converting layer 220 is given by way of example as a possible way in which the first and second wavelength converting layers 120, 220 can be formed, but should not limit the present invention.

Referring again FIG. 1, the first illumination element 100, the second illumination element 200 and the third illumination element 300 are separated by gaps 500. In some embodiments, the dimension of each of the gaps 500 is on the order of micrometers or nanometers. This is a significant improvement over the interval between LED packages in a traditional light source module, which ranges from several millimeters to several tens of millimeters. Therefore, the gaps 500 are such that the size of the light source module can be reduced and the light outputted by the light source module can be made more uniform.

Figure 3:
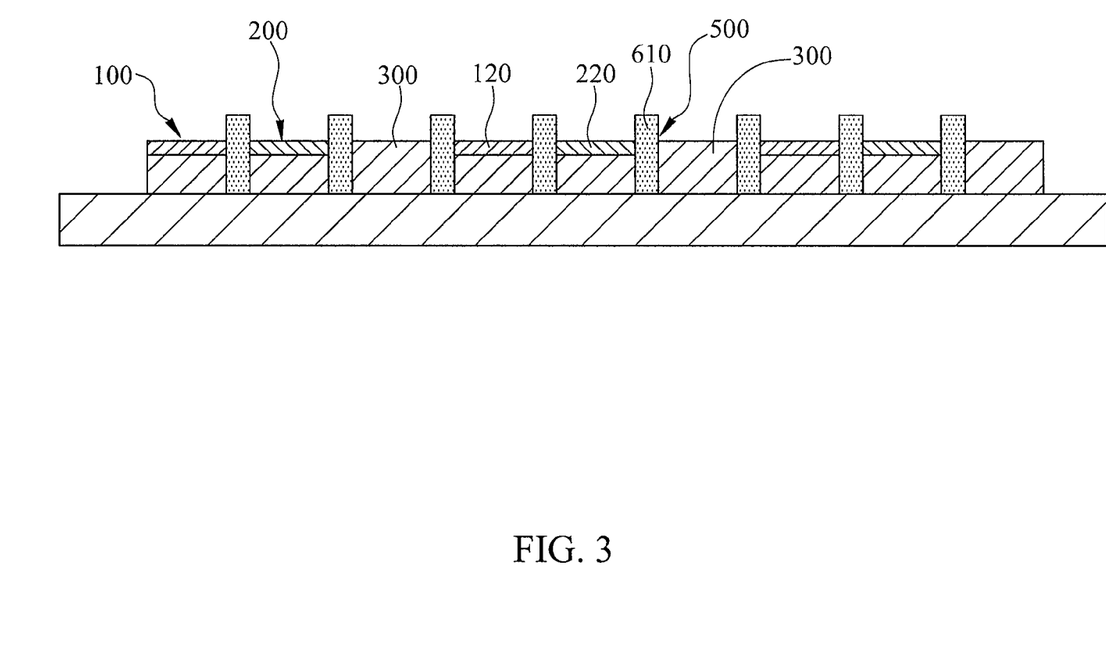
FIG. 3 is a cross-sectional view of the light source module in accordance with another embodiment of the present invention.

FIG. 3 is a cross-sectional view of the light source module in accordance with another embodiment of the present invention. The main difference between this embodiment and the embodiment shown in FIG. 1 is that the light source module in this embodiment can further include a plurality of optical reflective layers 610 respectively placed in the gaps 500. In this embodiment, the optical reflective layers 610 are formed by reflective material that is capable of reflecting the light emitted from the first illumination element 100, the second illumination element 200 and the third illumination element 300, so as to prevent the light of an illumination element from being emitted onto another adjacent illumination element. For example, if the first illumination element 100 emits red light and the second illumination element 200 emits green light, the optical reflective layer 610 therebetween prevents the green light outputted by the second illumination element 200 from exciting the first wavelength converting layer 120 in the first illumination element 100 to become red light, so that the luminance of the green light outputted by the second illumination element 200 will not reduce.

In some embodiments, the height of the optical reflective layers 610 is not lower than the first wavelength converting layer 120, the second wavelength converting layer 220 and the blue LED chip of the third illumination element 300. Through such a configuration, the light outputted by the first illumination element 100, the second illumination element 200 and the third illumination element 300 can be prevented from emitting onto adjacent illumination elements.

Figure 4:
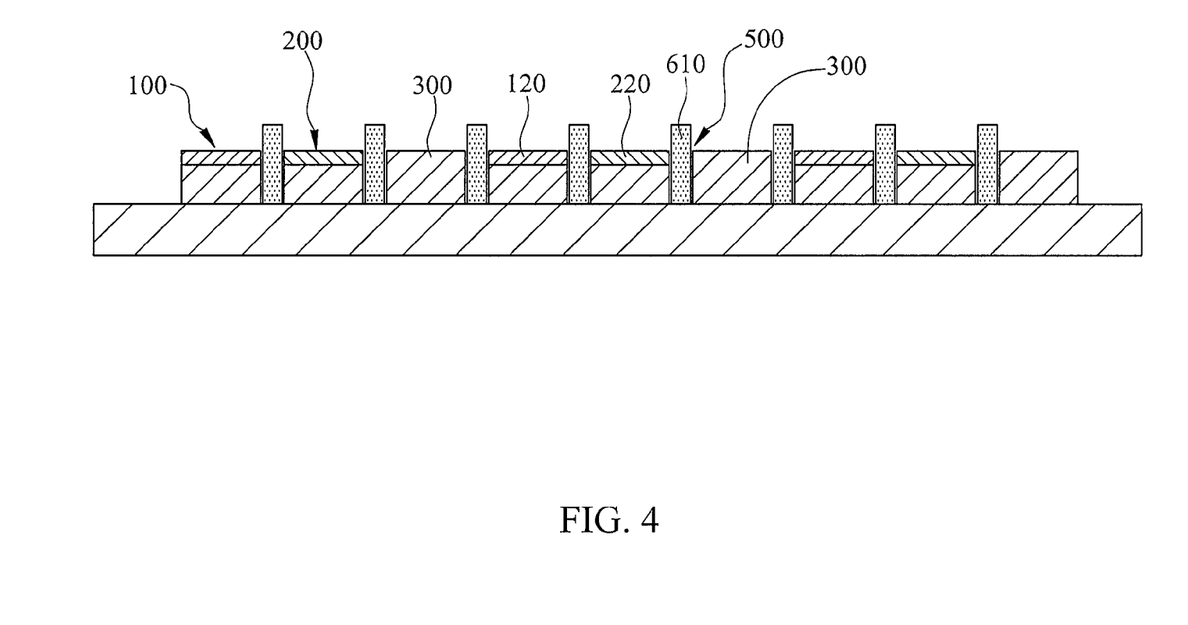
FIG. 4 is a cross-sectional view of the light source module in accordance with another embodiment of the present invention.

FIG. 4 is a cross-sectional view of the light source module in accordance with another embodiment of the present invention. The main difference between this embodiment and the embodiment shown in FIG. 3 is that the light source module of this embodiment includes a plurality of optical absorptive layers 620 replacing the optical reflective layers 610 shown in FIG. 3. Specifically, the optical absorptive layers 620 are respectively placed in the gaps 500. In this embodiment, the optical absorptive layers 620 are formed by material with a high degree of light absorbance, that is, material capable of absorbing the light emitted from the first illumination element 100, the second illumination element 200 and the third illumination element 300, so as to prevent the light of an illumination element from emitting onto another adjacent illumination element. For example, if the first illumination element 100 emits red light and the second illumination element 200 emits green light, the optical absorptive layer 620 prevents the green light emitted from the second illumination element 200 from exciting the first wavelength converting layer 120 in the first illumination element 100 to become red light, so that the luminance of the green light outputted by the second illumination element 200 will not reduce.

In some embodiments, the height of the optical absorptive layers 620 is not lower than the first wavelength converting layer 120, the second wavelength converting layer 220 and the blue LED chip of the third illumination element 300. Through such a configuration, the light outputted by the first illumination element 100, the second illumination element 200 and the third illumination element 300 can be prevented from emitting onto adjacent illumination elements.

Figure 5:
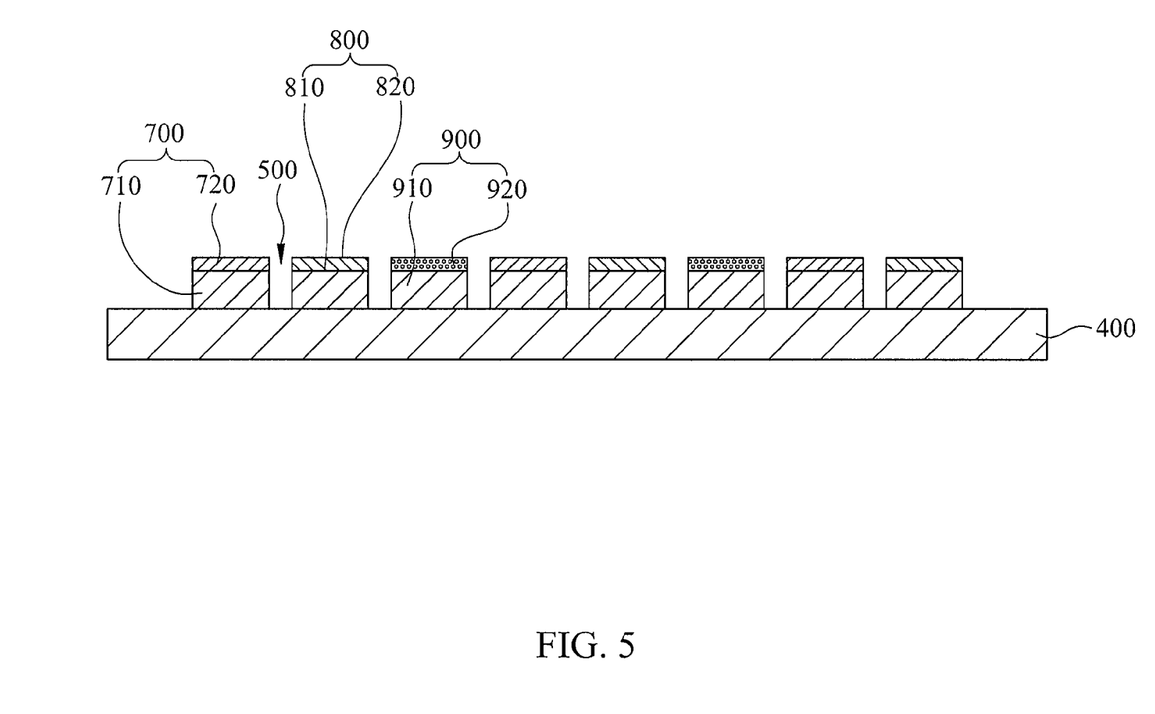
FIG. 5 is a cross-sectional view of the light source module in accordance with another embodiment of the present invention.

FIG. 5 is a cross-sectional view of the light source module in accordance with another embodiment of the present invention. As shown in this figure, the light source module includes a substrate 400, a first illumination element 700, a second illumination element 800 and a third illumination element 900. The first illumination element 700 includes a short wavelength LED chip 710 disposed on the substrate 400. The short wavelength LED chip 710 is covered by a first wavelength converting layer 720, so that the light in the range of the fourth wavelength emitted from the short wavelength LED chip 710 is converted to light in the range of a first wavelength. The second illumination element 800 includes a short wavelength LED chip 810 disposed on the substrate 400. The short wavelength LED chip 810 is covered by a second wavelength converting layer 820, so that the light in the range of the fourth wavelength emitted from the short wavelength LED chip 810 is converted to light in a range of a second wavelength. The third illumination element 900 includes a short wavelength LED chip 910 disposed on the substrate 400. The short wavelength LED chip 910 is covered by a third wavelength converting layer 920, so that the light in the range of the fourth wavelength emitted from the short wavelength LED chip 910 is converted to light in a range of a third wavelength.

Specifically, the short wavelength LED chips 710, 810 and 910 are directly mounted on the substrate 400 without being packaged. In some embodiments, the fourth wavelength of the short wavelength LED chips 710, 810 and 910 is in the range of ultraviolet light. For example, the fourth wavelength of the short wavelength LED chips 710, 810 and 910 is less than 400 nm.

In some embodiments, the first wavelength converting layer 720 includes red phosphor, red dye or red pigment, the second wavelength converting layer includes green phosphor, green dye or green pigment, and the third wavelength converting layer 920 includes blue phosphor, blue dye or blue pigment. Therefore, the first wavelength is in the range of red light, the second wavelength is in the range of green light, and the third wavelength is in the range of the blue light. Because the fourth wavelength of the short wavelength LED chips 710, 810 and 910 is in the range of ultraviolet light, the short wavelength LED chips 710, 810 and 910 can respectively excite the first wavelength converting layers 720, 820 and 820 to generate red light, green light and blue light.

Figure 6:
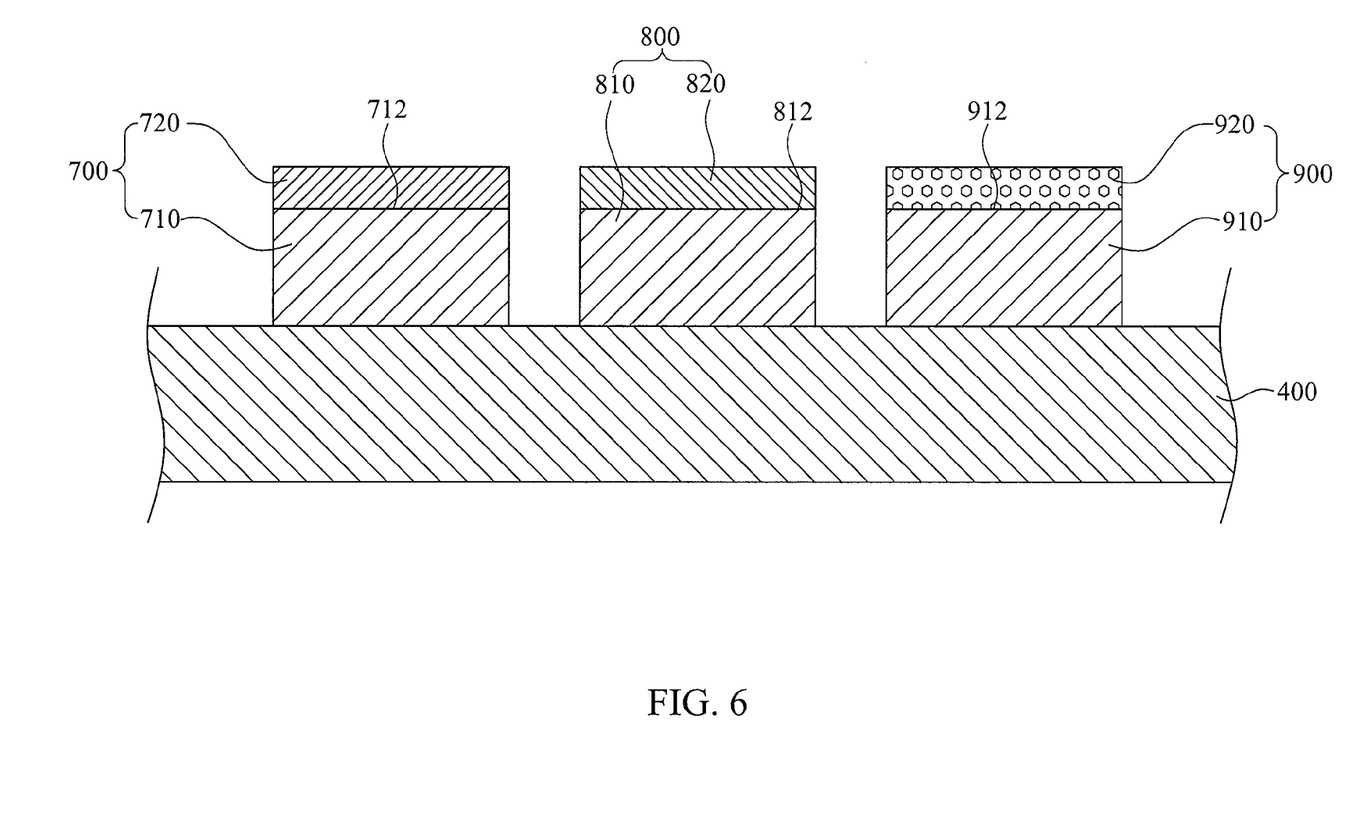
FIG. 6 is a partial cross-sectional view of the light source module of FIG. 5.

FIG. 6 is a partial cross-sectional view of the light source module of FIG. 5. In some embodiments, a first light outputting surface 712 of the short wavelength LED chip 710 of the first illumination element 700 is directly covered by the first wavelength converting layer 720, a second light outputting surface 812 of the short wavelength LED chip 810 of the second illumination element 800 is directly covered by the second wavelength converting layer 820, and a third light outputting surface 912 of the short wavelength LED chip 910 of the third illumination element 900 is directly covered by the third wavelength converting layer 920.

In some embodiments, the area of the first wavelength converting layer 720 is substantially equal to the area of the first light outputting surface 712 of the short wavelength LED chip 710 of the first illumination element 700, the area of the second wavelength converting layer 820 is substantially equal to the area of the second light outputting surface 812 of the short wavelength LED chip 810 of the second illumination element 800, and the area of the third wavelength converting layer 920 is substantially equal to the area of the third light outputting surface 912 of the short wavelength LED chip 910 of the third illumination element 900. In other words, the first wavelength converting layer 720 exactly covers the whole first light outputting surface 712 of the short wavelength LED chip 710, the second wavelength converting layer 820 exactly covers the whole second light outputting surface 812 of the short wavelength LED chip 810, and the third wavelength converting layer 920 exactly covers the whole third light outputting surface 912 of the short wavelength LED chip 910.

Similar to the embodiment shown in FIG. 1, the first wavelength converting layer 720, the second wavelength converting layer 820 and the third wavelength converting layer 920 can be formed by various processes. For example, the first wavelength converting layer 720, the second wavelength converting layer 820 and the third wavelength converting layer 920 can be respectively formed on the short wavelength LED chips 710, 810 and 910 by photolithography. Specifically, the material of the first wavelength converting layer 720 (e.g., red phosphor, red dye or red pigment) can be blended in a negative photoresist, and after exposure development, the first wavelength converting layer 720 can remain on the first light outputting surface 712 of the short wavelength LED chip 710 based on the mask design. Similarly, the material of the second wavelength converting layer 820 (e.g., green phosphor, green dye or green pigment) can also be blended in the negative photoresist, and after exposure development, the second wavelength converting layer 820 can remain on the second light outputting surface 812 of the short wavelength LED chip 810 based on the mask design. Similarly, the third wavelength converting layer 920 (e.g., blue phosphor, blue dye or blue pigment) can also be blended in the negative photoresist, and after exposure development, the third wavelength converting layer 920 can remain on the third light outputting surface 912 of the short wavelength LED chip 910 based on the mask design.

It is noted that the photolithography process to form the first wavelength converting layer 720, the second wavelength converting layer 820 and the third wavelength converting layer 920 is given by way of example as a possible way in which the first, second and third wavelength converting layers 720, 820, 920 can be formed, but should not limit the present invention.

In some embodiments, the fourth wavelength of the short wavelength LED chips 710, 810 and 910 is in the range of blue light. For example, the fourth wavelength of the short wavelength LED chips 710, 810 and 910 is in the range between 400 nm and 490 nm. When the fourth wavelength of the short wavelength LED chips 710, 810 and 910 is in the range of blue light, the first wavelength converting layer 710 includes red phosphor, red dye or red pigment, the second wavelength converting layer 820 includes green phosphor, green dye or green pigment, and the third wavelength converting layer 920 includes yellow phosphor, yellow dye or yellow pigment.

Referring again to FIG. 5, the first illumination element 700, the second illumination element 800 and the third illumination element 900 are separated by gaps 500. In some embodiments, the dimension of each of the gaps 500 is on the order of micrometers or nanometers. This is a significant improvement over the interval between LED packages in a traditional light source module, which ranges from several millimeters to several tens of millimeters. Therefore, the gaps 500 are such that the size of the light source module can be reduced and the light outputted from the light source module can be made more uniform.

Figure 7:
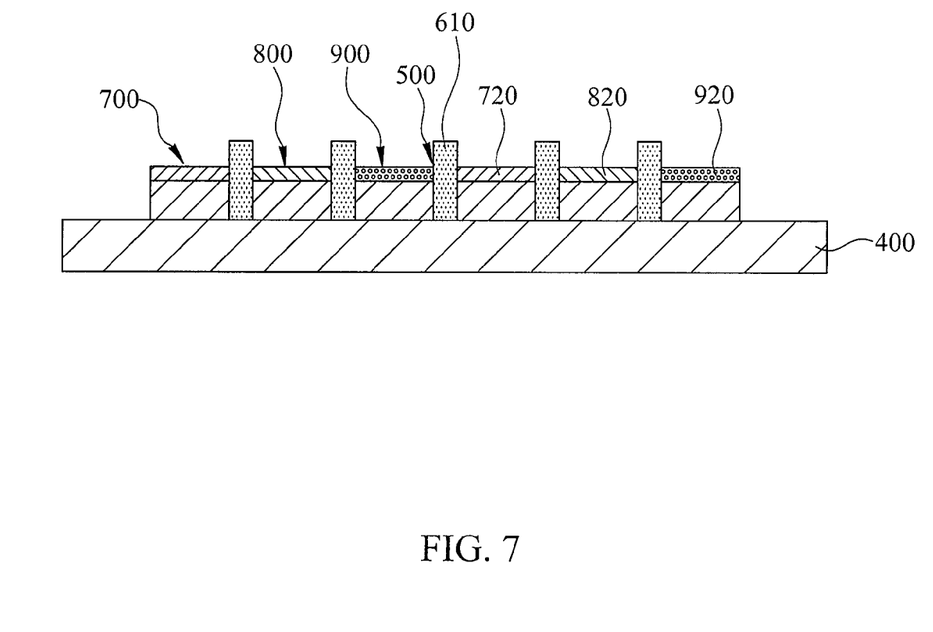
FIG. 7 is a cross-sectional view of the light source module in accordance with another embodiment of the present invention.

FIG. 7 is a cross-sectional view of the light source module in accordance with another embodiment of the present invention. The main difference between this embodiment and the embodiment shown in FIG. 5 is that the light source module in this embodiment can further include a plurality of optical reflective layers 610 respectively placed in the gaps 500. In this embodiment, the optical reflective layers 610 are formed by reflective material that is capable of reflecting the light emitted from the first illumination element 700, the second illumination element 800 or the third illumination element 900, so as to prevent the light of an illumination element from emitting onto another adjacent illumination element.

In some embodiments, the height of the optical reflective layer 610 is not lower than the first wavelength converting layer 720, the second wavelength converting layer 820 and the third wavelength converting layer 920. Through such a configuration, the light passing through the first wavelength converting layer 720, the second wavelength converting layer 820 and the third wavelength converting layer 920 can be prevented from emitting onto adjacent illumination elements.

Figure 8:
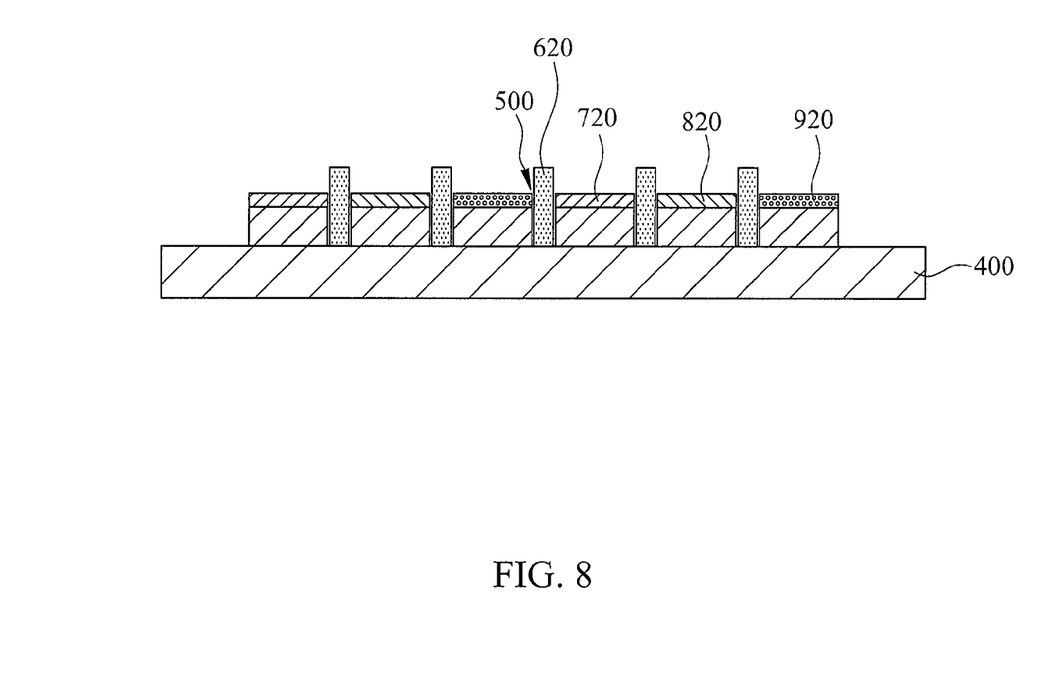
FIG. 8 is a cross-sectional view of the light source module in accordance with another embodiment of the present invention.

FIG. 8 is a cross-sectional view of the light source module in accordance with another embodiment of the present invention. The main difference between this embodiment and the embodiment shown in FIG. 7 is that the light source module of this embodiment includes a plurality of optical absorptive layers 620 replacing the optical reflective layers 610 shown in FIG. 7. Specifically, the optical absorptive layers 620 are respectively placed in the gaps 500. In this embodiment, the optical absorptive layers 620 are formed by material with a high degree of light absorbance, that is, material capable of absorbing the light emitted from the first illumination element 700, the second illumination element 800 and the third illumination element 900, so as to prevent the light of an illumination element from emitting onto another adjacent illumination element.

In some embodiments, the height of the optical absorptive layers 620 is not lower than the first wavelength converting layer 720, the second wavelength converting layer 820 and the third wavelength converting layer 920. Through such a configuration, the light passing through the first wavelength converting layer 720, the second wavelength converting layer 820 and the third wavelength converting layer 920 can be prevented from emitting onto adjacent illumination elements.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light source module, comprising:
   a substrate;
   a first illumination element comprising a blue LED chip disposed on the substrate and a first wavelength converting layer that covers the blue LED chip of the first illumination element, wherein blue light emitted from the blue LED chip of the first illumination element is converted to light in the range of a first wavelength by the first wavelength converting layer;
   a second illumination element comprising a blue LED chip disposed on the substrate and a second wavelength converting layer that covers the blue LED chip of the second illumination element, wherein blue light emitted from the blue LED chip of the second illumination element is converted to light in the range of a second wavelength by the second wavelength converting layer;
   a third illumination element comprising a blue LED chip; and
   a plurality of separated optical absorptive layers, wherein the first illumination element, the second illumination element and the third illumination element are separated by gaps, wherein the optical absorptive layers are placed in the gaps, and wherein the height of the optical absorptive layers is not lower than the first wavelength converting layer, the second wavelength converting layer and the blue LED chip of the third illumination element.

2. The light source module of claim 1, wherein a first light outputting surface of the blue LED chip of the first illumination element is directly covered by the first wavelength converting layer, and a second light outputting surface of the blue LED chip of the second illumination element is directly covered by the second wavelength converting layer.

3. The light source module of claim 2, wherein the area of the first wavelength converting layer is substantially equal to the area of the first light outputting surface of the LED chip of the first illumination element, and the area of the second wavelength converting layer is substantially equal to the area of the second light outputting surface of the LED chip of the second illumination element.

4. The light source module of claim 1, wherein the first wavelength converting layer comprises red phosphor, red dye or red pigment, and the second wavelength converting layer comprises green phosphor, green dye or green pigment.

5. A light source module, comprising:
a substrate;
a first illumination element comprising a short wavelength LED chip disposed on the substrate and a first wavelength converting layer covering the short wavelength LED chip of the first illumination element, wherein the light in the range of a ultraviolet light wavelength emitted from the short wavelength LED chip of the first illumination element is converted to the light in the range of a first wavelength by the first wavelength converting layer;
a second illumination element comprising a short wavelength LED chip disposed on the substrate and a second wavelength converting layer covering the short wavelength LED of the second illumination element, wherein the light in the range of the ultraviolet light wavelength emitted from the short wavelength LED chip of the second illumination element is converted to the light in the range of a second wavelength by the second wavelength converting layer;
a third illumination element comprising a short wavelength LED chip disposed on the substrate and a third wavelength converting layer covering the short wavelength LED of the third illumination element, wherein the light in the range of the ultraviolet light wavelength emitted from the short wavelength LED chip of the third illumination element is converted to the light in the range of a third wavelength by the third wavelength converting layer; and
a plurality of separated optical absorptive layers, wherein the first illumination element, the second illumination element and the third illumination element are separated by gaps, the dimension of each of the gaps is on the order of micrometers or nanometers, and the optical absorptive layers are placed in the gaps.

6. The light source module of claim 5, wherein the height of the optical absorptive layer is not lower than the first wavelength converting layer, the second wavelength converting layer and the third wavelength converting layer.

* * * * *